United States Patent [19]
Hesselink et al.

[11] Patent Number: 6,104,511
[45] Date of Patent: Aug. 15, 2000

[54] REFLECTOR-BASED OFF-AXIS OPTICAL SYSTEM FOR HOLOGRAPHIC STORAGE

[75] Inventors: Lambertus Hesselink, Woodside; Mark E. McDonald, Mt. View; John F. Heanue, San Jose; Andrew J. Daiber, Palo Alto, all of Calif.

[73] Assignee: Siros Technologies, Inc., San Jose, Calif.

[21] Appl. No.: 09/116,291

[22] Filed: Jul. 16, 1998

[51] Int. Cl.⁷ ........................................ G03H 1/26
[52] U.S. Cl. .................. 359/22; 359/16; 359/364; 369/103; 365/215; 365/216; 365/124; 365/125
[58] Field of Search .................. 359/15, 16, 22, 359/364, 365, 366; 365/124, 125, 215, 216; 369/103

[56] References Cited

U.S. PATENT DOCUMENTS

| | | | |
|---|---|---|---|
| 3,190,171 | 6/1965 | Reed | 88/1 |
| 3,748,015 | 7/1973 | Offner | 350/55 |
| 4,293,186 | 10/1981 | Offner | 350/27 |
| 4,796,984 | 1/1989 | Wynne | 350/444 |
| 4,920,220 | 4/1990 | Phaff | 544/90 |
| 5,440,669 | 8/1995 | Rakuljic et al. | 359/7 |
| 5,450,218 | 9/1995 | Heanue et al. | 359/21 |
| 5,519,651 | 5/1996 | Redfield | 365/125 |

OTHER PUBLICATIONS

Offner, A., New concepts in projection mask aligners, Opt. Eng., vol. 14, No. 2, pp. 130–132, 1975.

*Primary Examiner*—Cassandra Spyrou
*Assistant Examiner*—Craig Curtis
*Attorney, Agent, or Firm*—Lumen Intellectual Property Services

[57] ABSTRACT

The holographic storage and retrieval system according to the present invention comprises one convex reflector and one concave reflector having the same optical axis. The reflective surfaces of the two reflectors are opposite each other. The concave reflector is normally larger than the convex reflector. The holographic storage medium is positioned at the focal surface of the concave reflector. The spherical reflector system according to the present invention has nearly ideal performance off-axis: high bandwidth, low aberration imaging is permitted at a number of radial and axial locations. Thus, multiple SLM/CCD pairs can be placed off-axis to access the same storage medium and implement multiple interconnects.

52 Claims, 6 Drawing Sheets

REFLECTOR-BASED OFF-AXIS OPTICAL SYSTEM FOR HOLOGRAPHIC STORAGE

GOVERNMENT RIGHTS CLAUSE

This invention was made with Government support under SBIR grant No. NAS5-33257. The Government has certain rights in this invention.

RELATED APPLICATION

This patent application refers to two concurrently filed patent applications: "DMD Illumination Coupler" by Mark McDonald, and "Reflection Optics Reference Beam Telescope" by Andrew J. Daiber et. al.

FIELD OF THE INVENTION

This invention relates to the field of holographic data storage. Particularly, it relates to an off-axis imaging system using curved reflectors.

BACKGROUND OF THE INVENTION

The primary attributes of holographic digital data storage systems are the large data storage density and capacity, fast access times and extremely fast data transfer rates. During the recording process, a beam from a laser is split into two beams: a signal beam, which is used to encode data, and a reference beam. The signal beam passes through an electronic mask, called a spatial-light modulator (SLM), that represents data with a matrix of squares; each square can be directed to transmit light, corresponding to a binary 1, or to block light, corresponding to a binary 0. The signal beam is then focused onto the holographic medium, typically a crystal, where it intersects with the reference beam to create an interference pattern. This interference pattern interacts with the holographic medium in such a way that the original reference beam is incident in the original signal beam, which is then refocused onto a detector array similar to that used in electronic cameras.

The nature of holography is such that the reference beam must be incident at the same angle used to record the data for efficient output. This puts stringent requirements on the optical alignment, but can be used to derive an advantage by allowing more than one hologram to be recorded in the same volume by using reference beams at different angles. The total capacity of such a system is the capacity per page multiplied by the number of individual pages stored in the same volume. Capacity can be further increased by using multiple volumes of media.

For information on conventional volume holographic storage see for example U.S. Pat. No. 4,920,220, 5,450,218, and 5,440,669. In conventional volume holographic storage, each bit is stored as a hologram extending over the entire volume of the storage medium. Multiple bits are encoded and decoded together in pages, or two-dimensional arrays of bits. Multiple pages are stored within the volume by angular, wavelength, phase-code, or related multiplexing techniques. Each page can be independently retrieved using its corresponding reference beam. The parallel nature of the storage approach allows high transfer rates and short access times, since as many as $10^6$ bits within one page can be stored and retrieved simultaneously.

High capacity is possible because of the volume nature of holography; other technologies use single or multiple surface access. High transfer rates are possible because of the parallel manner in which data are recorded and replayed; arrays of up to 1K by 1K are available, and will continue to increase in size. Fast access is possible because the angle of the reference beam can be changed electronically or optically, rather than by mechanical motion.

An example of a conventional holographic storage and retrieval system is shown in FIG. 1. An illumination beam from a laser 102 is divided into a signal beam 108 and a reference beam 106 by a beam splitter 104. Both the signal beam 108 and the reference beam 106 are expanded by telescopes 112 and 113 respectively. The signal beam 108 passes through a transmissive SLM 114 to form an encoded signal beam 116. A lens 118 and a holographic storage medium 120 are positioned such that the Fourier Transform of a page of SLM 114 is in the center of the holographic storage medium 120. During recording, an expanded reference beam 117 interacts with the encoded signal beam 116 inside the holographic storage medium 120 to form a hologram. During readout, the reference beam 117 is incident on the holographic storage medium by itself. The diffraction of the reference beam 117 by the hologram forms a reconstructed signal beam 119, which passes through a lens 122 and is incident on a CCD detector array 124. The Fourier transform of the SLM 114's data is inversely Fourier transformed by the lens 122, and the reconstructed image of the SLM 114's data is recorded by the CCD detector array. Notice that the encoding device SLM 114, Fourier transform lens 118, and the inverse Fourier transform lens 122 are on the optical axis, which is characteristic for conventional refractive imaging systems.

From physical considerations of the holographic process, it is desirable to pack as many bits as possible into a data page. This implies imaging a high resolution SLM with, for example, 1024×1024 pixels onto the CCD array, which is a formidable optical design problem, and difficult to solve with a lens system. In the past, optical designs have incorporated standard Fourier Transform lenses, which are costly, bulky and are generally optimized for on-axis performance. It would be highly desirable from a commercial and technical perspective to utilize a simple optical system that has good off-axis performance, is cheap and does not require very strict alignment tolerances. This would allow large SLM devices to be imaged onto large CCD arrays, having small pixel sizes. Alternatively, it would allow us to use a number of SLMs to be simultaneously used to synthesize extremely large page sizes not easily achievable with single large arrays. Such a system would have extremely fast transfer rates.

Conventional multi-element refractive imaging systems are ineffective for parallel channel architectures. Additional channels must be sent off axis, which causes severe aberrations, seriously limiting either the page size or the number of interconnects. While a number of parallel interconnect geometries can be designed assuming perfect optics, none have been demonstrated because of the difficulty of imaging multiple megabit pages through a traditional, multi-element lens.

An imaging system using all reflective optics has been disclosed by G. A. Reed in the U.S. Pat. No. 3,190,171. The prior art teaches the construction of a viewing device using a relay imaging system. This relay imaging system uses concave and convex reflectors. Similar systems have also been taught in U.S. Pat. Nos. 4,796,984, and 4,293,186. The concave-convex-reflector imaging system has excellent off-axis optical performance. Application of this system to lithography technology has been taught in U.S. Pat. No. 3,748,015, and in A. Offner's article: "New Concepts in Projection Mask Aligners", OPTICAL ENGINEERING, Vol. 14, No. 2, 1975.

SUMMARY OF THE INVENTION

Briefly, and in general terms, the inventors have designed a novel system using spherical reflectors which have superb optical performance at a low f-number. The system according to the present invention allows multiple SLM pages to be recorded and readout with multiple CCD arrays by using an off-axis optical system with exceptional performance.

The key properties of the design include the application of at least one concave reflector and one convex reflector, and the use of off-axis SLM and CCD arrays. This design provides for an imaging configuration as well as optical Fourier transformation of the input data.

More specifically, the holographic storage and retrieval system according to the present invention comprises one convex reflector and one concave reflector having the same optical axis. The reflective surfaces of the two reflectors are opposite each other. The concave reflector is normally larger than the convex reflector.

In the preferred embodiment, by way of example and not necessarily by way of limitation, the concave reflector and the convex reflector are both spherical. The concave reflector has a center $C_1$ and a radius of curvature $R_1$, and the convex reflector has a center $C_2$ and a radius of curvature $R_2$. Furthermore, the convex reflector is substantially close to the Fourier surface of the concave reflector. Preferably, $C_1$ is close to $C_2$, or even coincides with $C_2$, and $R_1$ is close or equal to two times $R_2$. This arrangement ensures a symmetric optical system wherein the convex reflector is at or close to the focal surface of the concave reflector. The storage medium is positioned between the concave reflector and the convex reflector, and is placed substantially close to the convex reflector. Consequently, the storage medium is at or near the Fourier surface of the concave reflector.

The encoding device, preferably an SLM, is positioned at the center plane of the concave reflector. A particular encoding method using a DMD illumination coupler in conjunction with DMD is described in detail in the concurrently filed U.S. Pat. application "DMD Illumination Coupler", application Ser. No. 09/116,656. The center plane refers to a plane which is perpendicular to the optical axis, and which contains the center of the concave reflector $C_1$. This arrangement ensures that a page of data in the encoding device is Fourier transformed inside the storage medium. The decoding device, preferably a CCD detector array, is also positioned at the center plane. The decoding device is symmetric to the encoding device with respect to the optical axis, and to the center $C_1$ of the concave reflector. The position of the decoding device satisfies the condition where the decoding device catches the image of the encoding device. The decoding device is at the conjugate position of the encoding device with respect to the optical system formed by the concave mirror and the convex mirror. From another perspective, the Fourier transform of the data page inside the storage medium is inversely Fourier transformed at the decoding device.

In order to describe the path of the signal beam, one may divide the signal beam into two portions. A portion S(i) of the signal beam extends from the encoding device to the concave reflector. A portion S(1) of the signal beam is reflected by the concave reflector. The portion S(1) passes though the storage medium before it is incident on the convex reflector. The reconstructed signal beam is also divided into two portions: a portion S(2) of the reconstructed signal beam extends from the storage medium to the concave reflector. A portion S(o) of the reconstructed signal beam is reflected by the concave reflector, and is incident on a decoding device.

The reference beam interacts with the signal beam S(1) inside the storage medium to form a hologram during the recording process. During the readout process, the reference beam is incident at the storage medium by itself. The diffraction of the reference beam forms the reconstructed signal beam S(2) corresponding to the original signal beam. The reconstructed signal beam S(o) forms a reconstructed image corresponding to the original data pages. The reconstructed image is recorded by the decoding device.

A single reference beam R can interact with multiple signal beams inside the storage medium simultaneously to achieve parallel processing during the recording process. Furthermore, the diffraction of the reference beam can form multiple reconstructed signal beams in the readout process, and generate multiple reconstructed images in the decoding device. Multiple encoding and decoding devices E[k] and C[k] can be applied as long as each pair of the encoding and decoding devices satisfies the symmetry requirement. For example, there are a set of K encoding and decoding devices. Correspondingly, there are a set of K signal beams and reconstructed signal beams. The set of K signal beams S(k), where in k is greater than or equal to 1 and smaller than or equal to K, can be divided into portions individually for description purposes. Portions S(k,i) of the signal beams extend from the encoding devices to the concave reflector $M_1$. Portions S(k,1) of the signal beams are reflected by the concave reflector. The portions S(k,1) pass though the storage medium before it is incident on the convex reflector.

The reconstructed signal beams are also divided. Portions S(k,2) of the reconstructed signal beams extend from the storage medium to the concave reflector. A portion S(k,o) of the reconstructed signal beam is reflected by the concave reflector, and are incident on a decoding device. This embodiment allows parallel processing of multiple pages of data simultaneously.

The reference beam R is delivered to the holographic crystal, preferably by a reflector based reference beam telescope. One may refer to the concurrently filed U.S. Pat. application "Reflector-Based Reference Beam Telescope" for details. Angular multiplexing, phase code multiplexing, wavelength multiplexing, and other multiplexing techniques can be applied to increase the capacity of the storage system. Furthermore, the holographic crystal can be translated to increase the holographic storage capacity.

The optical performance of this system is exceptionally good for a very simple optical layout. This system has no distortion. Coma is zero. Astigmatism is small, and there is no lateral color. The sagital field is flat, and the tangential field bends slightly backwards. The reference beam is incident normal to the recording medium. Although this system is optimized for one-to-one magnification, it also performs well for magnification ratios between 0.9 to 1.1. In addition, aplanatic lenses can be added to the design between the center plane and the storage medium to further improve off-axis performance for low f-numbers.

A detailed explanation of the invention is contained in the detailed specification with reference to the appended drawing figures.

DETAILED DESCRIPTION

Figure 1:
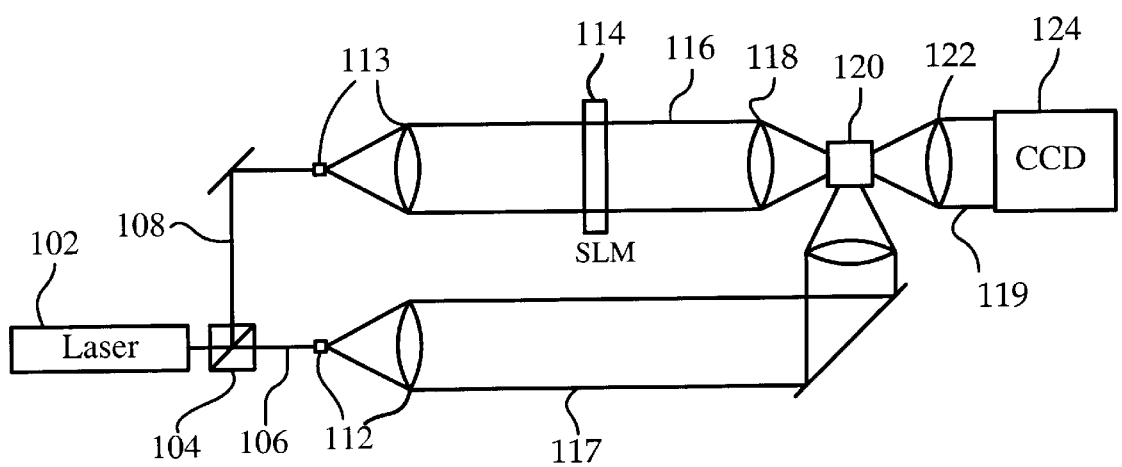
FIG. 1 is a schematic view showing an example of a prior art holographic storage and retrieval system.
Figure 2:
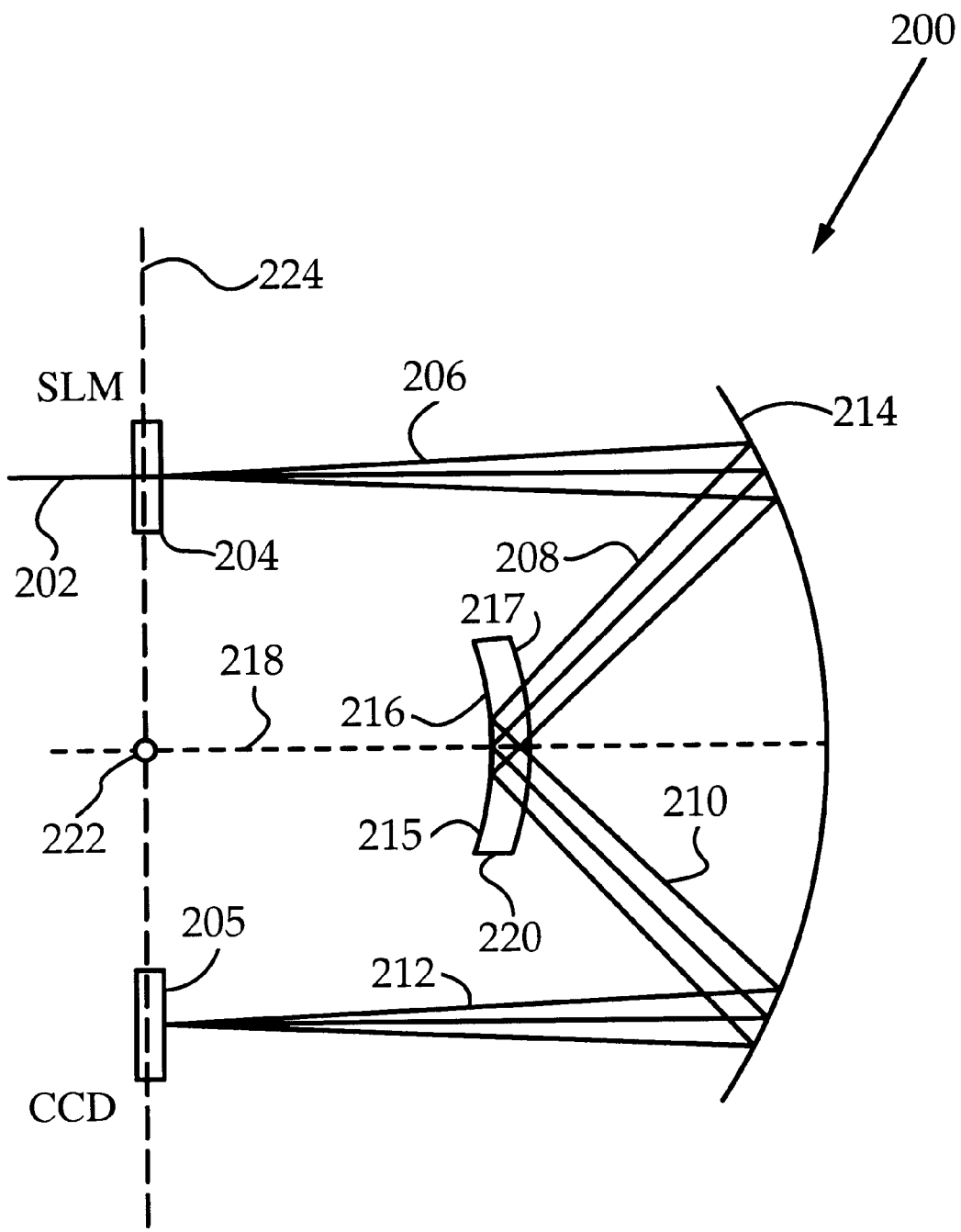
FIG. 2 is a schematic view of an embodiment of the present invention.

FIG. 2 shows an embodiment 200 according to the present invention. The key components of this embodiment are a concave reflector 214 and a holographic storage medium, preferably a holographic crystal 220. A part of the back surface 215 of the holographic crystal 220 is coated with reflective material to form a convex reflector 216.

The concave reflector 214 and the convex reflector 216 are both spherical reflectors. The convex reflector 216 is smaller than the concave reflector 214. They are positioned so that they have the same optical axis 218. Their reflective surfaces are opposing each other.

The convex reflector 216 is positioned at the focal surface of the concave reflector 214. In the embodiment, the center $C_1$ of the concave reflector 214 and the center $C_2$ of the convex reflector 216 coincide at a center 222, and the radius of curvature of the concave reflector 214 is two times the radius of curvature of the convex reflector 216. This arrangement ensures that the holographic crystal is located at the focal surface of the concave reflector 214.

The front surface 217 of the holographic crystal 220 is cut and polished to form a spherical surface. The center of the spherical surface 217 coincides with center 222 in order to minimize the spherical aberration.

Of course, it is feasible to use a rectangular holographic crystal and convex mirror to replace the monolithic polished and coated holographic crystal 220. However, the optical quality will be sacrificed due to aberrations. In this embodiment, additional optical components, preferably refractive surfaces, need to be applied to the embodiment in order to compensate for the spherical aberration. These additions are well-known to a person of average skill in the art.

The embodiment shown in FIG. 2 also includes an encoding device, preferably an SLM 204, and a decoding device, preferably a CCD detector array 205. The CCD 205 needs to be positioned at the conjugate position of the SLM 204. Preferably, the SLM 204 and the CCD 205 are positioned in a plane 224 which is perpendicular to the optical axis 218, and which passes through the center 222. Furthermore, SLM 204 and CCD 205 are located at two positions which are symmetric to the center 222. More specifically, the CCD 205 and the SLM 204 are positioned at the same distance away from the concave mirror. This distance is two times the focal length of the concave mirror. Finally, the holographic crystal 220 is located at the Fourier surface of the plane 224.

A signal beam 202 is encoded by the SLM 204 to form an encoded signal beam 206. The encoded signal beam 206 is reflected by the concave reflector 214 to form a light beam 208. The light beam 208 interacts with a reference beam inside the holographic crystal 220 during the recording process. The reference beam, which is not shown in FIG. 2, is incident normal to the plane of the figure. During the readout process, the reference beam is diffracted by the hologram inside the holographic crystal 220 to form a reconstructed signal beam 210. The beam 210 is reflected by the concave reflector 214 to form a beam 212. The light beam 212 forms a reconstructed image of the SLM 204's data page which is recorded by the CCD detector array. During the recording process, the Fourier transformed image of the data page in SLM is recorded by the holographic crystal 220. During the readout process, the recorded image is inversely Fourier transformed and recorded by the CCD 205. (The light beam 206 corresponds to the portion S(1) described in the summary section. Similarly, light beams 208, 210, and 212 correspond to portions S(2), S(3), and S(4) respectively.)

In the embodiment, the radii of curvature $R_1$ and $R_2$ of the concave reflector 214 and the convex reflector 216 are 16.0 cm and 7.6 cm respectively. The radius of curvature of the front surface 217 of the holographic crystal is 8.6 cm. The SLM 204 and the CCD 205 are each mounted 3.0 cm from the optical axis 218. It should be noted that these parameters can be adjusted according to specific applications. A person of average skill in the art will be able to determine these parameters for a specific application based on the principles of the present invention. For example, all the parameters can be scaled to accommodate some physical constraint introduced by packaging requirements.

The spherical reflector system according to the present invention has nearly ideal performance off-axis: high bandwidth, low aberration imaging is permitted at a number of radial and axial locations. Thus, multiple SLM/CCD pairs can be placed off-axis to access the same storage medium and implement multiple interconnects. This remarkable performance is fundamental to the concentric spherical geometry; if the reflector system is translated to an "equivalent" unfolded refractive lens design, the off-axis performance, as well as the ability to implement multiple interconnects is generally lessened. The extremely high space-bandwidth product of the spherical reflector geometry (as demonstrated by its ability to image high density pages at multiple off-axis locations) can thus be used to demonstrate parallel interconnect geometries that were previously unrealistic. Note that the ability to coherently and simultaneously write holograms with data from multiple SLMs is expected to dramatically increase the total information storable at a signal storage medium location.

Figure 3:
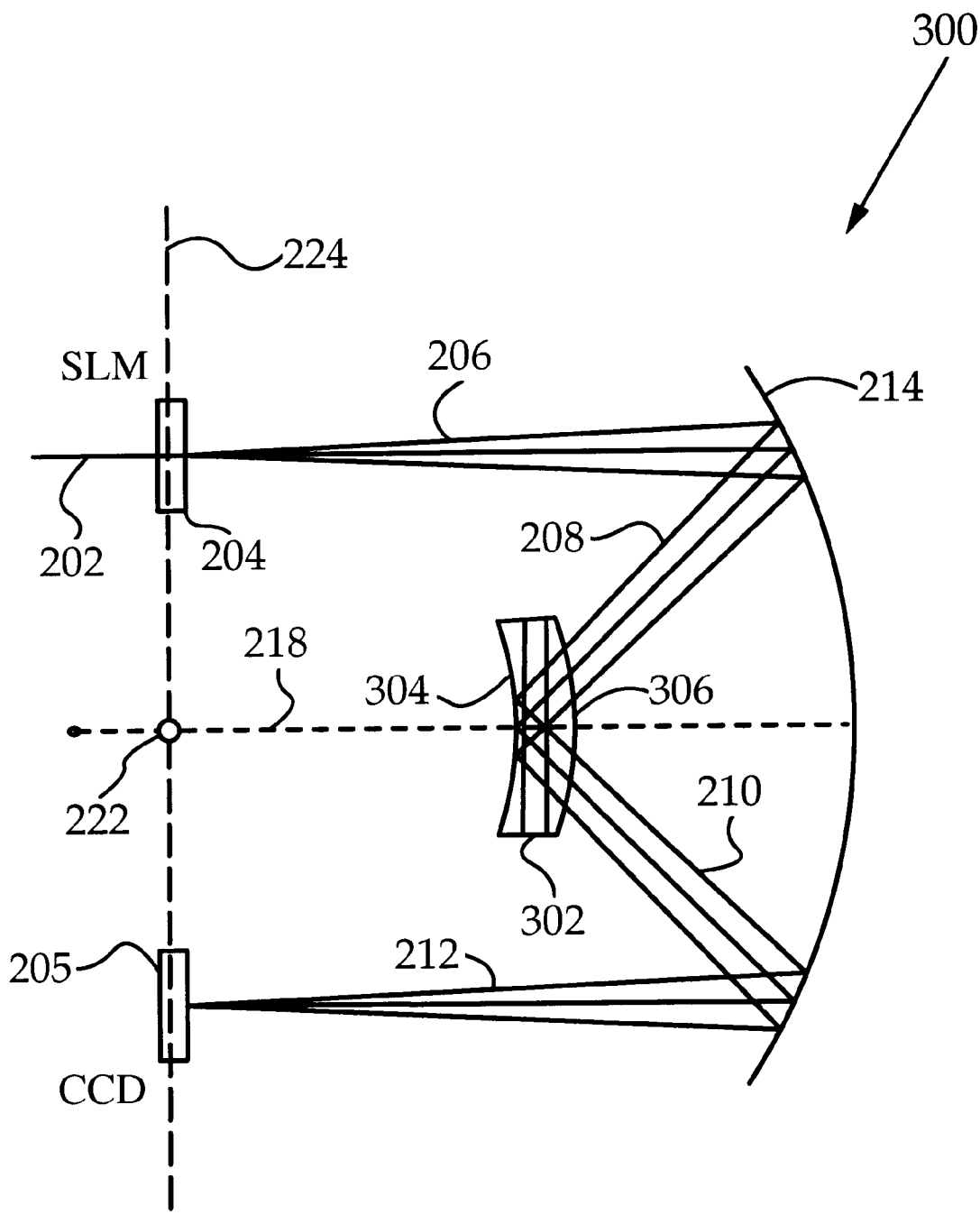
FIG. 3 is a schematic view of another embodiment according to the present invention.

FIG. 3 shows another embodiment 300 which is a variation of the embodiment 200 shown in FIG. 2. In this embodiment, the holographic crystal 220 of the embodiment 200 is replaced by a combination of a rectangular holographic crystal 302, a plano-convex lens 306 and a plano-concave lens 304. The concave surface of the plano-concave lens is coated with reflective material to form a convex reflector 304. The lens 306, the crystal 302 and the convex reflector 304 are attached as illustrated in FIG. 3. The inventors realize that it may be difficult to process the front and back surface of the holographic crystal 220 in the previous embodiment. The plano-concave and plano-convex lenses are commercially available, and the rectangular holographic crystal is easily processed. Thus, this embodiment ensures a significant reduction of cost. However, a rectangular crystal introduces greater aberration to the optical system, and reduces the resolution. The planoconvex lens 306 and the convex reflector 304 are included in order to compensate for the aberration and maintain the optical performance of the system.

Figure 4:
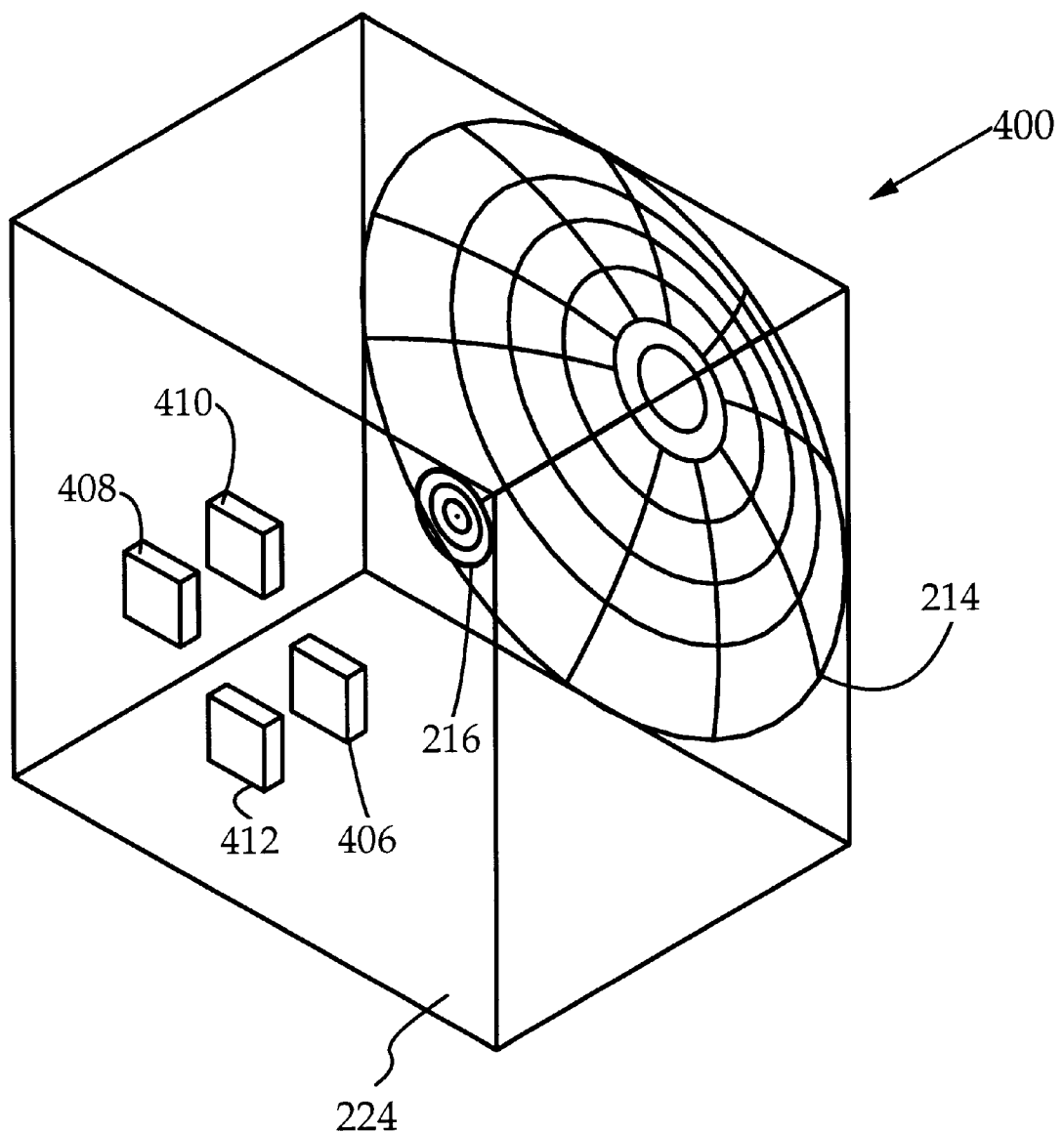
FIG. 4 is a three dimensional schematic view of another embodiment illustrating parallel processing architecture according to the present invention.

FIG. 4 shows another embodiment 400 which is a variation of the embodiment 200. In particular, FIG. 4 is a three dimensional view showing the parallel processing architecture according to the present invention.

Two SLMs 406 and 410 and two CCDs 408 and 412 are positioned in the plane 224. The CCD 408 is at the conjugate position of the SLM 406, and the CCD 412 is at the conjugate position of the SLM 410. During recording, encoded signal beams (not shown in the figure) from both SLM 406 and 410 interact with a single reference beam (not shown in the figure) simultaneously. Consequently, the data pages of both the SLM 406 and 410 can be recorded in the holographic crystal 217 simultaneously. The holographic crystal 217 is behind the convex reflector 216 and is not shown in the figure. During readout, a single reference beam is incident on the holographic crystal 217. The diffraction of the reference beam creates reconstructed signal beams which form the reconstructed images of SLM 406 and 410 on the CCD 408 and 412 respectively. This parallel architecture can be extended to include more than two pairs of SLM-CCDs. The excellent off-axis optical quality of this embodiment allows it to have the unique ability to simultaneously transmit multiple, high space-bandwidth images, and permits multiple parallel interconnects to the same holographic storage medium.

Figure 5:
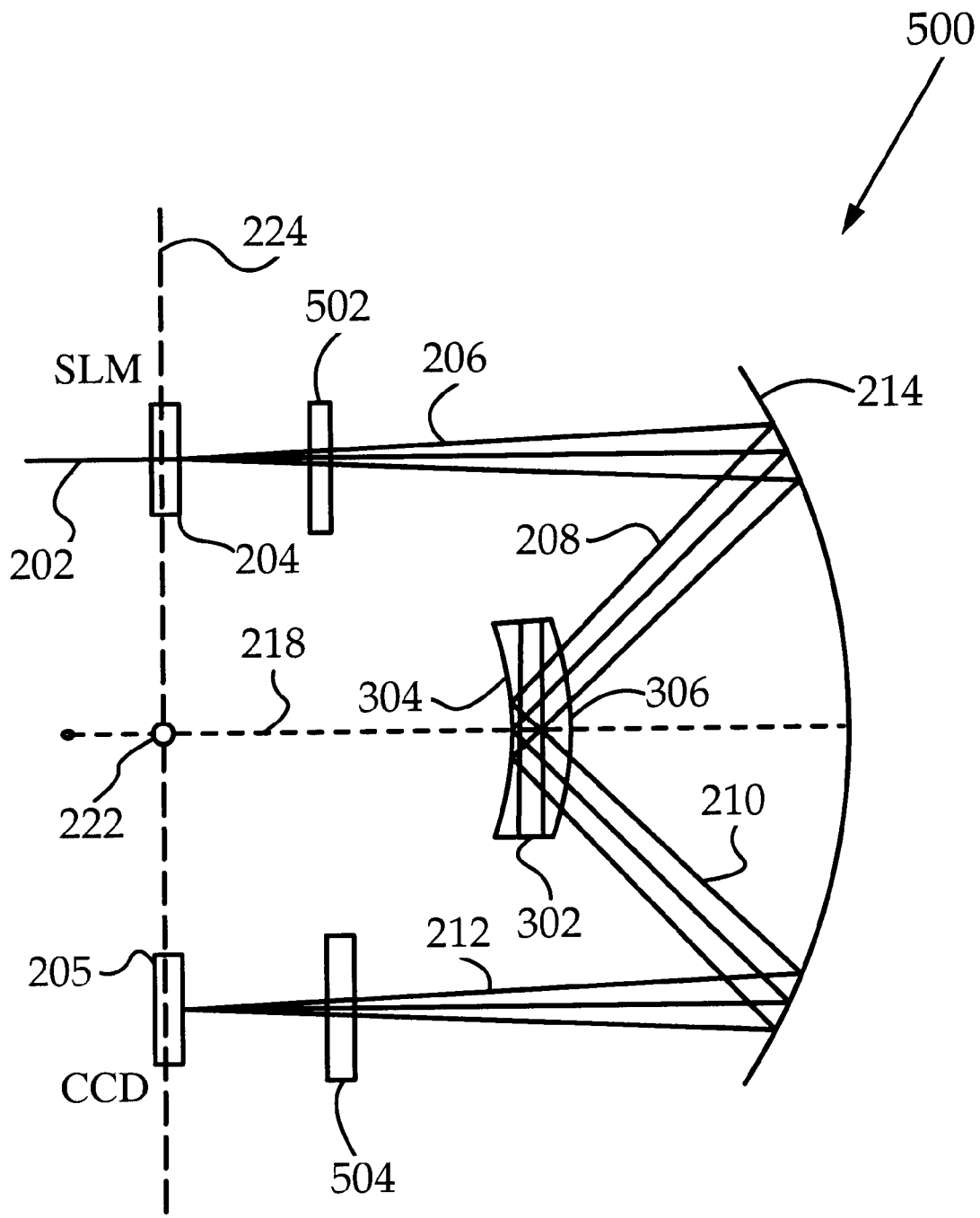
FIG. 5 is a schematic view of another embodiment which includes aberration correctors according to the present invention.

FIG. 5 is a variation of the embodiment 300 which includes aberration correctors. Refractive optical components 502 and 504 are used to compensate for the spherical aberrations, and further improve the optical performance of the holographic system. The aberration correctors can be positioned anywhere in the path of the signal beam and the reconstructed signal beam, preferably between the plane 224 and the convex reflector 216 due to spatial considerations. The shapes of the aberration correctors are determined by the shape and the thickness of the plano-convex lens 306, the thickness of the holographic crystal 302, the position of the crystal 302, reflectors 216 and 214.

Figure 6A:
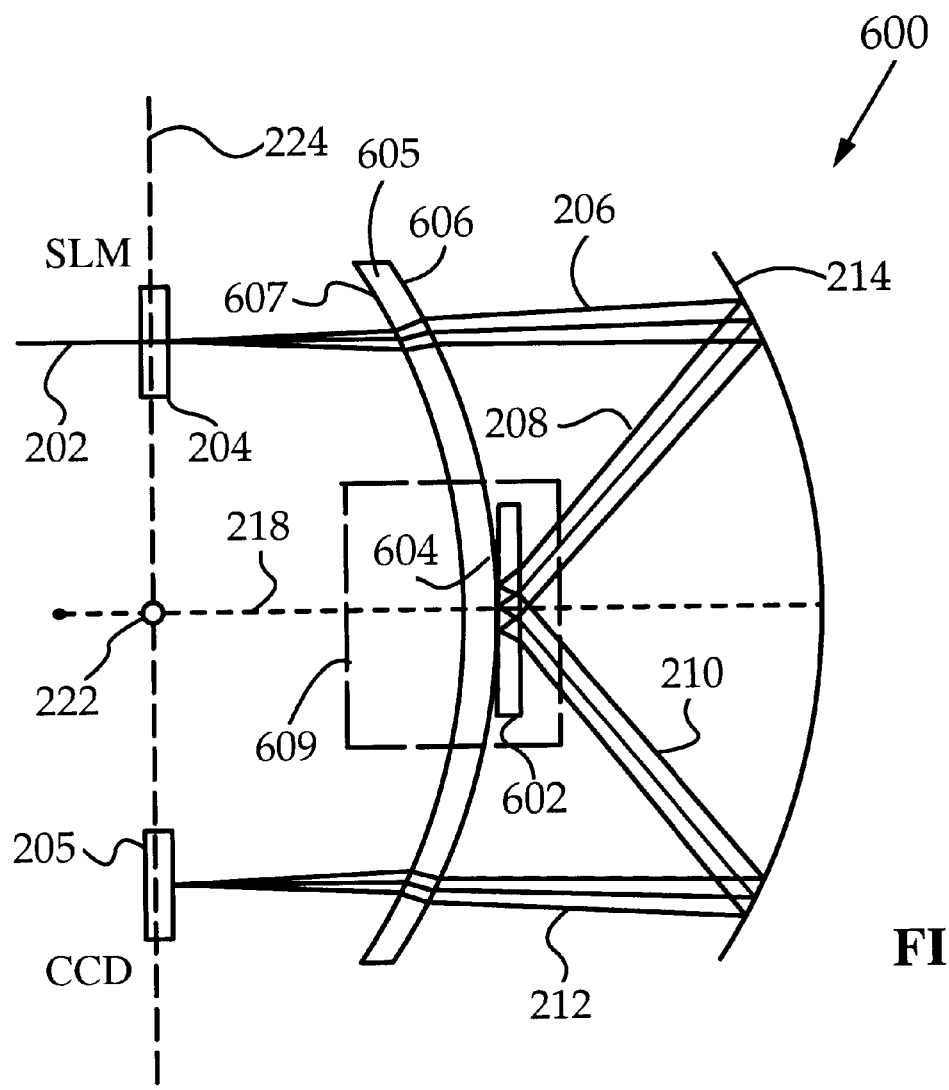
FIGS. 6A–B are schematic views of the most preferred embodiment according to the present invention.
Figure 6B:
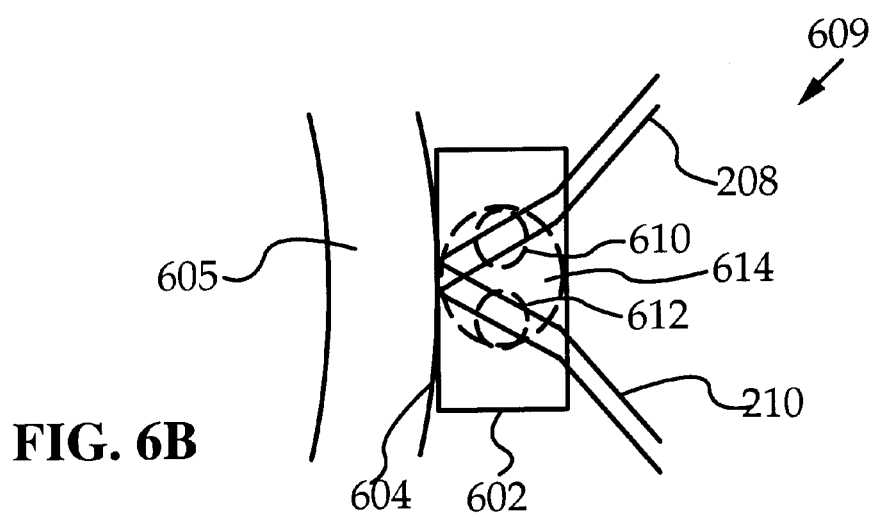

The most preferred embodiment 600, as is shown in FIGS. 6A–B, includes a spherical aberration corrector 605 which has a spherical outer surface 606 and a spherical inner surface 607. The spherical aberration corrector 605 can also be called a meniscus. The outer surface 606 has a center $C_o$ and a radius $R_o$. The inner surface 607 has a center $C_i$ and a radius $R_i$, and $R_o$ is greater than $R_i$. The center $C_o$ and the center $C_i$ are substantially close to each other, preferably coincide with each other, and with the center 222. Furthermore, the outer surface 606 of this aberration corrector can be coated with reflective material and form the convex reflector 604. A rectangular shaped holographic storage medium 602 is positioned adjacent to the convex reflector 604. A rectangular shaped storage medium is chosen because it is readily available. The aberration introduced by the rectangular crystal is compensated by the aberration corrector 605. A storage medium of other shapes can also be used. The meniscus/convex reflector 605, the holographic crystal 602, the concave reflector 214 can be attached together to form a monolithic unit. If the SLM comprises a DMD used in conjunction with a DMD illumination coupler, the detector array can be used in conjunction with an appropriate prism or other optically thick material to balance aberration generated by the DMD illumination coupler.

During recording, encoded signal beam 206 passes through the aberration corrector 605 before it is incident at the concave reflector 214. The reflected beam 208 is incident at the holographic storage medium 602. The reconstructed signal beam 210 extends from the storage medium 602 to the concave reflector 214. The reflected beam 212 passes the aberration corrector 606 and enters the detector array 206.

The thickness of the aberration corrector 605 is chosen such that the aberration of the signal beam 206 caused by the optical system, including the concave and convex reflector 214 and 604, the storage medium 602 and the corrector 605, is minimized. A person of average skill in the art will be able to determine the parameters of the aberration corrector based on specific requirements of the holographic systems.

FIG. 6B illustrates a section 609 of the embodiment 600 in detail. FIG. 6B further shows different operational modes related to the size and position of the reference beam.

Preferably, the reference beam is incident normal at a surface which is perpendicular to the incident surface of the signal beam 208. This geometry ensures that the reference beam and the signal beam 208 are perpendicular to each other. In an alternative embodiment, the reference beam and the signal beam can be counter-propagating.

The dashed circles 610, 612 and 614 illustrate the incident reference beams in the perpendicular geometry corresponding to different operatinal modes. Reference beam 614 corresponds to the preferred embodiment, where the reference beam size matches the size of the storage medium 602. This embodiment is most preferred because it is most efficient. In an alternative embodiment, the reference beam 610 interferes with a portion of the signal beam which has not reach the convex reflector 604. In this case, the convex reflector 604 is not used in the writing of a hologram, and yet is used in the reading of the hologram. When this scheme is used in a write-only holographic system, the convex reflector 604 is not necessary. Yet the convex reflector 604 is needed in a reading system in order to read the hologram written in this fashion. In another embodiment, the reference beam 612 interferes with a portion of the signal beam which is reflected by the convex reflector 604. In this case, the convex reflector 604 is necessary for the writing of a hologram, and yet is unnecessary for the reading of the hologram.

It will be clear to one skilled in the art that the above embodiment may be altered in many ways without departing from the scope of the invention. Accordingly, the scope of the invention should be determined by the following claims and their legal equivalents.

What is claimed is:

1. A holographic data storage and retrieval system comprising:
   a) a concave reflector;
   b) a convex reflector opposite said concave reflector;
   c) a storage medium;
   d) a reference beam R incident on said storage medium; and
   e) a set of signal beams and reconstructed signal beams {S(k)} incident on said storage medium, on said concave reflector, and on said convex reflector, wherein:
      a signal beam S(k) comprises an input portion S(k,i), and an inter-reflector portion S(k,1),
      a reconstructed signal beam comprises an inter-reflector portion S(k,2), and an output portion S(k,o),
      said input portion S(k,i) is incident on said concave reflector,
      said inter-reflector portion S(k,1) extends from said concave reflector and is incident on said storage medium,
      said inter-reflector portion S(k,2) extends from said storage medium and is incident on said concave reflector, and
      said output portion S(k,o) extends from said concave reflector.

2. The system of claim 1 wherein said concave reflector comprises a substantially spherical surface of a radius $R_1$ and a center $C_1$.

3. The system of claim 2 wherein said convex reflector comprises a substantially spherical surface of a radius $R_2$ and a center $C_2$.

4. The system of claim 3 wherein said center $C_1$ is substantially close to said center $C_2$.

5. The system of claim 3 wherein said center $C_1$ and said center $C_2$ coincide.

6. The system of claim 3 wherein said radius $R_2$ is substantially close to $R_1/2$.

7. The system of claim 3 further comprising an aberration corrector situated in the path of said signal beam S(k), such that said signal beam S(k) passes through said aberration corrector.

8. The system of claim 3 further comprising an aberration corrector situated between said center C2 and said convex reflector, wherein said aberration corrector is positioned so that said portion of signal beam S(k,i) passes a first portion of said aberration corrector before it is reflected by said concave reflector, said aberration corrector being characterized by an outer surface, an inner surface and a material between said outer surface and said inner surface.

9. The system of claim 8 wherein said portion of signal beam S(k,o) passes through a second portion of said aberration corrector.

10. The system of claim 8 wherein said aberration corrector is substantially close to a center of said concave reflector.

11. The system of claim 10 wherein said outer surface is spherical characterized by a center $C_o$ and a radius $R_o$, and said inner surface is spherical characterized by a center $C_i$ and a radius $R_i$, and $R_o \geq R_i$.

12. The system of claim 11 wherein said center $C_o$ and said center $C_i$ substantially coincide.

13. The system of claim 11 wherein said center $C_o$ and said center $C_i$ substantially coincide with said center $C_1$.

14. The system of claim 11 wherein said outer surface has a reflective portion, and said reflective portion is said convex reflector.

15. The system of claim 14 wherein said medium is substantially close to said reflective portion of said outer surface.

16. The system of claim 3 wherein said convex reflector is situated substantially close to a focus of said concave reflector.

17. The system of claim 3 wherein said storage medium is adjacent to a focus of said concave reflector.

18. The system of claim 17 wherein a back surface of said storage medium comprises said convex reflector.

19. The system of claim 3 wherein said storage medium is adjacent to said convex reflector.

20. The system of claim 3 further comprising a set of encoding devices {E(k)}, said input portion S(k,i) extending from an encoding device E(k).

21. The system of claim 20 wherein a first distance between said encoding devices E(k) and said concave reflector is substantially equal to twice a focal length of said concave reflector.

22. The system of claim 20 further comprising a set of detector arrays {C(k)}, said output portion S(k,o) being incident on a detector C(k).

23. The system of claim 22 wherein a second distance between said detector C(k) and said concave reflector is substantially equal to a first distance between said encoding device E(k) and said concave reflector.

24. The system of claim 22 wherein a third distance between said detector C(k) and said concave reflector is substantially equal to twice a focal length of said concave reflector.

25. The system of claim 1 wherein said system is substantially monolithic.

26. The system of claim 1 further comprising spatial multiplexing means for moving said medium relative to said signal beam S(k).

27. The system of claim 26 wherein said medium is capable of a motion transverse to an optical axis of said system.

28. The system of claim 1 wherein k>1.

29. The system of claim 1 wherein k=1.

30. The system of claim 1 wherein said reference beam R and said signal beam S(k) are substantially perpendicular within said medium.

31. The system of claim 30 further comprising a multiplexing means for modulating said reference beam R, said multiplexing means being selected from the group consisting of wavelength, angular, shift and phase code multiplexing means.

32. The system of claim 1 wherein said reference beam R and said signal beam S(k) are counter propagating within said medium.

33. The system of claim 32 further comprising a multiplexing means for modulating said reference bean R, said multiplexing means being selected from the group consisting of wavelength, angular, shift and phase code multiplexing means.

34. A holographic data storage system comprising:
   a) a concave reflector;
   b) a convex reflector opposite said concave reflector;
   c) a storage medium;
   d) a reference beam R incident on said storage medium; and
   e) a set of signal beams {S(k)} incident on said storage medium, on said concave reflector, and on said convex reflector, wherein:
      a signal beam S(k) comprises an input portion S(k,i), and a first inter-reflector portion S(k,1),
      said input portion S(k,i) is incident on said concave reflector,
      said first inter-reflector portion S(k,1) extends from said concave reflector through said storage medium to said convex reflector, and from said convex reflector to said storage medium.

35. The system of claim 34 wherein:
   a) said concave reflector comprises a substantially spherical surface of a radius $R_1$ and a center $C_1$; and
   b) said convex reflector comprises a substantially spherical surface of a radius $R_2$ and a center $C_2$.

36. The system of claim 35 wherein:
   a) said center $C_1$ is substantially adjacent to said center $C_2$; and
   b) said radius $R_2$ is substantially close to $R_1/2$.

37. The system of claim 36 wherein said medium is substantially adjacent to said convex reflector.

38. The system of claim 34 further comprising a set of encoding means {E(k)}, said input portion S(k,i) extending from an encoding means E(k).

39. The system of claim 38 wherein a first distance between said encoding means E(k) and said concave reflector is substantially equal to twice a focal length of said concave reflector.

40. A holographic data storage system comprising:
   a) a concave reflector;
   b) a storage medium;
   c) a reference beam R incident on said storage medium; and
   d) a set of signal beams {S(k)} incident on said storage medium and on said concave reflector, wherein:
      a signal beam S(k) comprises an input portion S(k,i), and a first inter-reflector portion S(k,1), said input portion S(k,i) is incident on said concave reflector, said first inter-reflector portion S(k,1) extends from said concave reflector to said storage medium.

41. A holographic data retrieval system comprising:
a) a concave reflector;
b) a convex reflector opposite said concave reflector;
c) a storage medium;
d) a reference beam R incident on said storage medium; and
e) a set of reconstructed signal beams {S(k)}, wherein:
a reconstructed signal beam comprises an inter-reflector portion S(k,2), and an output portion S(k,o),
said inter-reflector portion S(k,2) extends from said storage medium to said convex reflector, and from said convex reflector to said concave reflector, and
said output portion S(k,o) extends from said concave reflector.

42. The system of claim 41 wherein:
a) said concave reflector comprises a substantially spherical surface of a radius $R_1$ and a center $C_1$; and
b) said convex reflector comprises a substantially spherical surface of a radius $R_2$ and a center $C_2$.

43. The system of claim 42 wherein:
a) said center $C_1$ is substantially adjacent to said center $C_2$; and
b) said radius $R_2$ is substantially equal to $R_1/2$.

44. The system of claim 43 wherein said medium is substantially adjacent to said convex reflector.

45. The system of claim 41 further comprising a set of detector arrays {C(k)}, said output portion S(k,o) being incident on a detector C(k).

46. The system of claim 45 wherein a second distance between said detector C(k) and said concave reflector is chosen such that a part of a page stored in said medium is imaged onto said detector C(k).

47. The system of claim 45 wherein a second distance between said detector C(k) and said concave reflector is substantially equal to twice a focal length of said concave reflector.

48. A holographic data retrieval system comprising:
a) a concave reflector;
b) a storage medium;
c) a reference beam R incident on said storage medium; and
d) a set of reconstructed signal beams {S(k)}, wherein:
a reconstructed signal beam comprises an inter-reflector portion S(k,2), and an output portion S(k,o),
said inter-reflector portion S(k,2) extends from said storage medium to said concave reflector, and
said output portion S(k,o) extends from said concave reflector.

49. A method of storing data in a holographic storage medium, said method comprising the steps of:
a) providing a concave reflector;
b) positioning a convex reflector opposite said concave reflector;
c) positioning a storage medium between said concave reflector and said convex reflector;
d) providing a reference beam R which is incident on said medium; and
e) providing a set of signal beams {S(k)} which are incident on said storage medium, on said concave reflector, and on said convex reflector, wherein:
a signal beam S(k) comprises an input portion S(k,i), and an inter-reflector portion S(k,1),
said input portion S(k,i) is incident on said concave reflector,
said inter-reflector portion S(k,1) extends from said concave reflector to said convex reflector through said storage medium, and from said convex reflector to said storage medium.

50. A method of storing data in a holographic storage medium, said method comprising the steps of:
a) providing a concave reflector;
b) positioning a storage medium;
c) providing a reference beam R which is incident on said medium; and
d) providing a set of signal beams {S(k)} which are incident on said storage medium and on said concave reflector, wherein:
a signal beam S(k) comprises an input portion S(k,i), and an inter-reflector portion S(k,1),
said input portion S(k,i) is incident on said concave reflector,
said inter-reflector portion S(k,1) extends from said concave reflector to said storage medium.

51. A method of retrieving data from a holographic storage medium, said method comprising the steps of:
a) providing a concave reflector;
b) positioning a convex reflector opposite said concave reflector;
c) positioning a storage medium between said concave reflector and said convex reflector;
d) providing a reference beam R which is incident on said medium; and
e) producing a set of reconstructed signal beams {S(k)}, wherein:
a reconstructed signal beam comprises an inter-reflector portion S(k,2), and an output portion S(k,o),
said inter-reflector portion S(k,2) extends from said storage medium to said convex reflector, and from said convex reflector to said concave reflector, and
said output portion S(k,o) extends from said concave reflector.

52. A method of retrieving data from a holographic storage medium, said method comprising the steps of:
a) providing a concave reflector;
b) positioning a storage medium;
c) providing a reference beam R which is incident on said medium; and
d) producing a set of reconstructed signal beams {S(k)}, wherein:
a reconstructed signal beam comprises an inter-reflector portion S(k,2), and an output portion S(k,o),
said inter-reflector portion S(k,2) extends from said storage medium to said concave reflector, and
said output portion S(k,o) extends from said concave reflector.

* * * * *